(12) United States Patent
Strobel et al.

(10) Patent No.: US 8,227,040 B2
(45) Date of Patent: Jul. 24, 2012

(54) METHOD OF CURING METAL ALKOXIDE-CONTAINING FILMS

(75) Inventors: Mark A. Strobel, Maplewood, MN (US); Michael J. Ulsh, Broomfield, CO (US); Christopher S. Lyons, St. Paul, MN (US); Judith M. Invie, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 462 days.

(21) Appl. No.: 12/521,604

(22) PCT Filed: Dec. 28, 2007

(86) PCT No.: PCT/US2007/089098
§ 371 (c)(1),
(2), (4) Date: Jun. 29, 2009

(87) PCT Pub. No.: WO2008/083310
PCT Pub. Date: Jul. 10, 2008

(65) Prior Publication Data
US 2010/0068382 A1    Mar. 18, 2010

Related U.S. Application Data

(60) Provisional application No. 60/882,625, filed on Dec. 29, 2006.

(51) Int. Cl.
C23C 16/448    (2006.01)
C23C 16/18    (2006.01)
B05D 3/02    (2006.01)

(52) U.S. Cl. ........ 427/377; 427/331; 427/337; 427/343; 427/372.2

(58) Field of Classification Search .................. None
See application file for complete search history.

(56) References Cited

U.S. PATENT DOCUMENTS

| | | | |
|---|---|---|---|
| 3,876,485 A * | 4/1975 | Kinlock et al. | 156/246 |
| 4,061,463 A * | 12/1977 | Bennett | 431/9 |
| 4,537,814 A | 8/1985 | Itoh et al. | |
| 4,629,756 A | 12/1986 | Kerbow | |
| 4,696,719 A | 9/1987 | Bischoff | |
| 4,722,515 A | 2/1988 | Ham | |
| 4,732,879 A | 3/1988 | Kalinowski et al. | |
| 4,842,893 A | 6/1989 | Yializis et al. | |
| 4,954,371 A | 9/1990 | Yializis | |

(Continued)

FOREIGN PATENT DOCUMENTS

EP    0 777 280    6/1997

(Continued)

OTHER PUBLICATIONS

Titanium Isopropoxide, Wikipedia, downloaded 2011, evidenciary.*

(Continued)

Primary Examiner — Timothy Meeks
Assistant Examiner — Joseph Miller, Jr.
(74) Attorney, Agent, or Firm — Adam Bramwell; James A. Baker; Lisa P. Fulton

(57) ABSTRACT

A method for forming an inorganic or hybrid organic/inorganic layer on a substrate, which method comprises applying a metal alkoxide to form a layer atop the substrate and exposing the metal alkoxide layer to heat from a catalytic combustion heater in the presence of water to cure the layer is provided.

23 Claims, 1 Drawing Sheet

U.S. PATENT DOCUMENTS

| | | | |
|---|---|---|---|
| 5,018,048 A | 5/1991 | Shaw et al. | |
| 5,032,461 A | 7/1991 | Shaw et al. | |
| 5,097,800 A | 3/1992 | Shaw et al. | |
| 5,125,138 A | 6/1992 | Shaw et al. | |
| 5,227,199 A * | 7/1993 | Hazlebeck et al. | 427/376.2 |
| 5,356,947 A | 10/1994 | Ali et al. | |
| 5,440,446 A | 8/1995 | Shaw et al. | |
| 5,530,581 A | 6/1996 | Cogan | |
| 5,547,908 A | 8/1996 | Furuzawa et al. | |
| 5,681,666 A | 10/1997 | Treger et al. | |
| 5,686,360 A | 11/1997 | Harvey, III et al. | |
| 5,736,207 A | 4/1998 | Walther et al. | |
| 5,925,438 A | 7/1999 | Ota et al. | |
| 6,004,660 A | 12/1999 | Topolski et al. | |
| 6,022,812 A | 2/2000 | Smith et al. | |
| 6,045,864 A * | 4/2000 | Lyons et al. | 427/255.23 |
| 6,083,628 A | 7/2000 | Yializis | |
| 6,146,225 A | 11/2000 | Sheats et al. | |
| 6,214,422 B1 | 4/2001 | Yializis | |
| 6,231,939 B1 | 5/2001 | Shaw et al. | |
| 6,268,694 B1 | 7/2001 | Fujimoto | |
| 6,288,842 B1 | 9/2001 | Florczak et al. | |
| 6,335,479 B1 | 1/2002 | Yamada | |
| 6,358,570 B1 | 3/2002 | Affinito | |
| 6,413,645 B1 | 7/2002 | Graff et al. | |
| 6,492,026 B1 | 12/2002 | Graff et al. | |
| 6,497,598 B2 | 12/2002 | Affinito | |
| 6,570,325 B2 | 5/2003 | Graff et al. | |
| 6,573,652 B1 | 6/2003 | Graff et al. | |
| 6,613,088 B1 | 9/2003 | Babizhayev | |
| 6,623,861 B2 | 9/2003 | Martin et al. | |
| 6,641,874 B2 | 11/2003 | Kuntz et al. | |
| 6,743,948 B1 | 6/2004 | Hosokawa | |
| 6,765,351 B2 | 7/2004 | Forrest | |
| 6,888,305 B2 | 5/2005 | Weaver | |
| 6,936,131 B2 | 8/2005 | McCormick | |
| 6,975,067 B2 | 12/2005 | McCormick et al. | |
| 6,991,826 B2 | 1/2006 | Pellerite et al. | |
| 7,018,713 B2 | 3/2006 | Padiyath | |
| 7,410,261 B2 | 8/2008 | Magarill | |
| 7,486,019 B2 | 2/2009 | Padiyath | |
| RE40,787 E | 6/2009 | Martin | |
| 2001/0031812 A1* | 10/2001 | Arimoto et al. | 524/300 |
| 2002/0022156 A1 | 2/2002 | Bright | |
| 2002/0176993 A1 | 11/2002 | Graff et al. | |
| 2003/0035939 A1* | 2/2003 | Muromachi et al. | 428/212 |
| 2003/0108749 A1 | 6/2003 | Ram | |
| 2003/0148128 A1 | 8/2003 | Tomaru et al. | |
| 2003/0213967 A1 | 11/2003 | Forrest et al. | |
| 2004/0032658 A1 | 2/2004 | Fleming | |
| 2004/0114101 A1 | 6/2004 | Thakrar | |
| 2004/0121146 A1 | 6/2004 | He et al. | |
| 2005/0089673 A1 | 4/2005 | Fleming et al. | |
| 2005/0112378 A1 | 5/2005 | Naruse | |
| 2006/0099725 A1 | 5/2006 | Shioya et al. | |
| 2006/0199014 A1 | 9/2006 | Ii et al. | |
| 2007/0231484 A1* | 10/2007 | Hishiya et al. | 427/248.1 |
| 2008/0292810 A1 | 11/2008 | Anderson et al. | |
| 2010/0073936 A1 | 3/2010 | Padiyath | |
| 2011/0229637 A1* | 9/2011 | Yasui et al. | 427/255.4 |

FOREIGN PATENT DOCUMENTS

| | | |
|---|---|---|
| EP | 0 915 105 | 5/1999 |
| JP | 1-283136 | 11/1989 |
| JP | 4-14440 | 1/1992 |
| JP | 6-316728 | 11/1994 |
| JP | 2002-205354 | 7/2002 |
| JP | 2003-53881 | 2/2003 |
| JP | 2005-60817 | 3/2005 |
| JP | 2005116706 * | 4/2005 |
| WO | WO 97/16053 | 5/1997 |
| WO | WO 00/02241 | 1/2000 |
| WO | WO 00/26973 A1 | 5/2000 |
| WO | WO 00/36665 | 6/2000 |
| WO | WO 01/03856 A1 | 1/2001 |
| WO | WO 01/16044 A1 | 3/2001 |
| WO | WO 01/58989 A1 | 8/2001 |
| WO | WO 02/090107 | 11/2002 |
| WO | WO 03/016589 | 2/2003 |
| WO | WO 2008/083304 | 7/2008 |
| WO | WO 2008/083304 A2 | 7/2008 |

OTHER PUBLICATIONS

Shaw et al., "Use of Vapor Deposited Acrylate Coatings to Improve the Barrier Properties of Metallized Film", Society of Vacuum Coaters, (1994), pp. 240-247, 37th Annual Technical Conference Proceedings.

Liu et al., "Fundamental Studies of a New Hybrid (inorganic-organic) Positively Charged Membrane. II. Membrane Preparation via Alcoholysis Reaction and Amination Processes of Silicone and Titanate Coupling Agents", Journal of Membrane Science, (2005), pp. 87-96, vol. 264, Elsevier B.V.

Roehrig et al., "Use of Evaporated Acrylate Coatings to Smooth the Surface of Polyester and Polypropylene Film Substrates", Journal of Plastic Film & Sheeting, (Jul. 1997), pp. 235-251, vol. 13, Technomic Publishing Co., Inc.

Affinito et al., "Polymer-Oxide Transparent Barrier Layers", Society of Vacuum Coaters, (1996), pp. 392-397, 39th Annual Technical Conference Proceedings.

Affinito et al., "Vacuum Deposited Polymer/Metal Multilayer Films for Optical Application", Thin Solid Films, (1995), pp. 43-48, vol. 270, Elsevier Science S.A.

Shaw et al., "A New Vapor Deposition Process for Coating Paper and Polymer Webs", 6th International Vacuum Coating Conference, (1992), pp. 96-102, Bakish Materials Corporation.

Shaw et al., "A New High Speed Process for Vapor Depositing Acrylate Thin Films: An Update", Society of Vacuum Coaters, 36th Annual Technical Conference Proceedings, (1993), pp. 348-352.

Bright et al., "Advances in Vacuum Web Coating", AIMCAL Fall Technical Conference Proceedings (1999), Abstract, 1 page.

Bright et al., "New Applications for Polymer Multi-Layer Technology", AIMCAL Fall Technical Conference Proceedings (1998), Abstract, 1 page.

Bright et al., "Transparent Barrier Coatings Based on ITO for Flexible Plastic Displays", Proceedings of the Thirteenth International Conference on Vacuum Web Coatings (1999), Abstract, 18 pages.

Bright et al., "Transparent and Conductive Ultra-barrier Coatings for Flexible Plastic Displays", American Vacuum Society, 46th International Symposium, Conference Proceedings (1999).

Jone et al., "An Improved Metallized Film Capacitor Using a New Acrylate Coating Process", Journal of Plastic Film & Sheeting, vol. 13, Apr. 1997, pp. 150-158.

"Polymethyl Methacrylate", Wikipedia [last edited Jun. 29, 2011], [retrieved from the Internet on Mar. 29, 2012], <http://en.wikipedia.org/wiki/Pmma>, 9 pages.

* cited by examiner

METHOD OF CURING METAL ALKOXIDE-CONTAINING FILMS

CROSS-REFERENCE TO RELATED APPLICATIONS

This application claims priority to Provisional Application Ser. No. 60/882,625, filed Dec. 29, 2006.

FIELD

This invention relates to a method for manufacturing thin inorganic or hybrid inorganic/organic films.

BACKGROUND

Inorganic or hybrid inorganic/organic layers have been used in thin films for electrical, packaging and decorative applications. These layers can provide desired properties such as mechanical strength, thermal resistance, chemical resistance, abrasion resistance, moisture barriers, oxygen barriers, and surface functionality that can affect wetting, adhesion, slippage, etc.

Inorganic or hybrid films can be prepared by a variety of production methods. These methods include liquid coating techniques such as solution coating, roll coating, dip coating, spray coating, spin coating, and dry coating techniques such as Chemical Vapor Deposition (CVD), Plasma Enhanced Chemical Vapor Deposition (PECVD), sputtering and vacuum processes for thermal evaporation of solid materials. Each of these methods has limitations.

Molecules have been functionalized with alkoxy silane functional groups to enable bonding of the molecules to substrate surfaces or to promote crosslinking. However, the reaction rate of the hydrolysis and condensation reactions involving alkoxy silanes are slower than the corresponding reaction rate of chlorosilanes or alkoxy titanates. In many applications, the alkoxy silane material requires heat, e.g., in an oven, for an extended time period (often hours or days) to realize a high degree of curing (bonding or crosslinking). Acids or bases have been used to catalyze these reactions, but the presence of an acid or base can be detrimental to the other components in the construction.

There remains a need for a method for curing inorganic or hybrid inorganic/organic films on substrates that can be completed rapidly with minimal damage to the substrate and coating.

SUMMARY OF THE INVENTION

The present invention provides, in one aspect, a method for forming an inorganic or hybrid organic/inorganic layer on a substrate, which method comprises applying a metal alkoxide to form a layer atop the substrate and exposing the metal alkoxide layer to heat from a catalytic combustion burner in the presence of water to cure the layer.

In a second aspect, the invention provides a method for forming a hybrid organic/inorganic layer on a substrate, which method comprises applying a mixture of a metal alkoxide and an organic compound, to form a layer atop the substrate, exposing the metal alkoxide layer to heat from a catalytic combustion heater in the presence of water to cure the layer, and curing the organic compound.

These and other aspects of the invention will be apparent from the accompanying drawing and this specification. In no event, however, should the above summaries be construed as limitations on the claimed subject matter, which subject matter is defined solely by the attached claims, as may be amended during prosecution.

DETAILED DESCRIPTION

Figure 1:
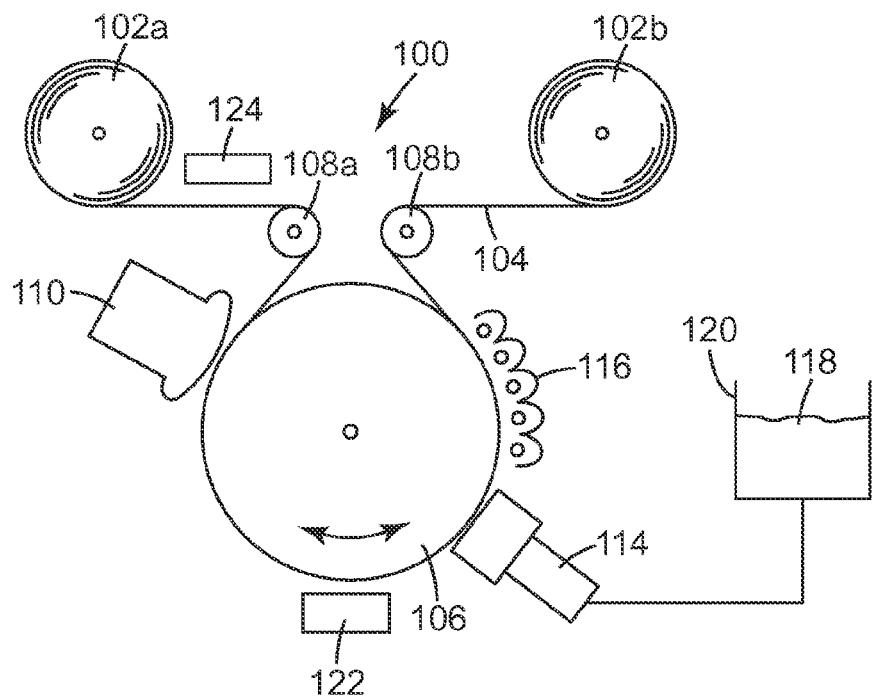
FIG. 1 is a schematic representation of a roll-to-roll apparatus for carrying out the disclosed method.

The words "a", "an", and "the" are used interchangeably with "at least one" to mean one or more of the elements being described. By using words of orientation such as "atop", "on", "covering", "uppermost", "underlying" and the like for the location of various elements in the disclosed coated articles, we refer to the relative position of an element with respect to a horizontally-disposed, upwardly-facing substrate. It is not intended that the substrate or articles should have any particular orientation in space during or after manufacture.

The term "polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

The term "crosslinked" polymer refers to a polymer in which the polymer chains are joined together by covalent chemical bonds, usually via crosslinking molecules or groups, to form a network polymer. A crosslinked polymer is generally characterized by insolubility, but may be swellable in the presence of an appropriate solvent.

The term "cure" refers to a process that causes a chemical change, e.g., a reaction with water, to solidify a film layer or increase its viscosity.

The term "metal" includes a pure metal or a metal alloy.

The term "optically clear" refers to a laminated article in which there is no visibly noticeable distortion, haze or flaws as detected by the naked eye at a distance of about 1 meter, preferably about 0.5 meters.

The term "optical thickness" when used with respect to a layer refers to the physical thickness of the layer times its in-plane index of refraction. In some optical designs a preferred optical thickness is about ¼ the wavelength of the center of the desired waveband for transmitted or reflected light.

A variety of substrates can be employed. In one embodiment, the substrates are light-transmissive and can have a visible light transmission of at least about 70% at 550 nm. Exemplary substrates are flexible plastic materials including thermoplastics such as polyesters (e.g., poly(ethylene terephthalate) (PET) or poly(ethylene naphthalate)s), polyacrylates (e.g., poly(methyl methacrylate)), polycarbonates, polypropylenes, high or low density polyethylenes, polysulfones, poly(ether sulfone)s, polyurethanes, polyamides, poly(vinyl butyral), poly(vinyl chloride), fluoropolymers (e.g., poly(vinylidene difluoride) and polytetrafluoroethylene), poly(ethylene sulfide), and thermoset materials such as epoxies, cellulose derivatives, polyimide, poly(imide benzoxazole) and polybenzoxazole. The substrate can also be a multilayer optical film ("MOF"), such as those described in U.S. Patent Application Publication No. 2004/0032658 A1.

In one embodiment, the disclosed films can be prepared on a substrate including PET. The substrate may have a variety of thicknesses, e.g., about 0.01 to about 1 mm. The substrate may however be considerably thicker, for example, when a self-supporting article is desired. Such articles can conveniently also be made by laminating or otherwise joining a disclosed film made using a flexible substrate to a thicker, inflexible or less flexible supplemental support.

Suitable metal alkoxides for forming a layer on a substrate are compounds that after deposition, can be cured via reaction with water to form a layer having one or more desirable properties. Exemplary metal alkoxide compounds can have the general formula $R^1_xM\text{-}(OR^2)_{y-x}$ where each $R^1$ is independently $C_1\text{-}C_{20}$alkyl, $(C_3\text{-}C_8)$cycloalkyl, $(C_2\text{-}C_7)$heterocycle, $(C_2\text{-}C_7)$heterocycle$(C_1\text{-}C_8)$alkylene-, $(C_6\text{-}C_{10})$aryl, $(C_6\text{-}C_{10})$aryl-$(C_1\text{-}C_8)$alkylene-, $(C_5\text{-}C_9)$heteroaryl, or $(C_5\text{-}C_9)$heteroaryl$(C_1\text{-}C_8)$alkylene-, and each $R^2$ is independently $(C_1\text{-}C_6)$alkyl, or $(C_2\text{-}C_6)$alkenyl, optionally substituted with $(C_1\text{-}C_4)$alkyl, hydroxyl or oxo, or two $OR^2$ groups can form a ring together with the atom to which they are attached.

The $R^1$ groups can be optionally substituted with one or more substituent groups, wherein each the substituents are independently oxo, halo, $-OR^a$, $-SR^a$, cyano, nitro, trifluoromethyl, trifluoromethoxy, $(C_3\text{-}C_8)$cycloalkyl, $(C_2\text{-}C_7)$heterocycle or $(C_2\text{-}C_7)$heterocycle $(C_1\text{-}C_8)$alkylene-, $(C_6\text{-}C_{10})$aryl, $(C_6\text{-}C_{10})$aryl$(C_1\text{-}C_8)$alkylene-, $(C_5\text{-}C_9)$heteroaryl, $(C_5\text{-}C_9)$heteroaryl$(C_1\text{-}C_8)$alkylene-, $-CO_2R^a$, $R^aC(=O)O-$, $R^aC(=O)-$, $-OCO_2R^a$, $R^bR^cNC(=O)O-$, $R^aOC(=O)N(R^b)-$, $R^bR^cN-$, $R^bR^cNC(=O)-$, $R^aC(=O)N(R^b)-$, $R^bR^cNC(=O)N(R^b)-$, $R^bR^cNC(=S)N(R^b)-$, $-OPO_3R^a$, $R^aOC(=S)-$, $R^aC(=S)-$, $-SSR^a$, $R^aS(=O)-$, $-NNR^b$, $-OPO_2R^a$, or two $R^1$ groups can form a ring together with the atom to which they are attached. Each $R^a$, $R^b$ and $R^c$ is independently hydrogen, $(C_1\text{-}C_8)$alkyl, or substituted $(C_1\text{-}C_8)$alkyl wherein the substituents include 1, 2, or 3 $(C_1\text{-}C_8)$alkoxy, $(C_3\text{-}C_8)$cycloalkyl, $(C_1\text{-}C_8)$alkylthio, amino, aryl, or aryl$(C_1\text{-}C_8)$alkylene, or $R^1$) and $R^c$, can form a ring together with the nitrogen atom to which they are attached. Exemplary rings include pyrrolidino, piperidino, morpholino, or thiomorpholino. Exemplary halo groups include fluoro, chloro, or bromo. In addition, the $R^1$ groups can also include fluorine or silicone containing oligomeric or polymeric groups such as a polydimethyl siloxyl group or a fluorinated group. Each $R^1$ and $R^2$ alkyl group can independently be a straight or branched chain. M represents a metal, x is 0, 1, 2, 3, 4, or 5, and y is the valence number of the metal, e.g., y can be 3 for aluminum, 4 for titanium and zirconium, and may vary depending upon the oxidation state of the metal, provided that $y-x \geq 1$, e.g., there must be at least one alkoxy group bonded to the metal atom. $R^2$ is generally a small alkyl group $(C_1\text{-}C_8)$. Large groups can slow the curing reaction. Exemplary $R^2$ groups include $C_1$, $C_2$ (including $-CH_2CH_3$ and $-C(=O)CH_3$), $C_3$, and $C_4$ alky groups.).

Exemplary metals include aluminum, antimony, arsenic, barium, bismuth, boron, cerium, gadolinium, gallium, germanium, hafnium, indium, iron, lanthanum, lithium, magnesium, molybdenum, neodymium, phosphorus, silicon, sodium, strontium, tantalum, thallium, tin, titanium, tungsten, vanadium, yttrium, zinc, and zirconium. or a mixture thereof.

Several metal alkoxides, e.g., organic titanates and zirconates, are available from DuPont Co. under the Tyzor™ trademark. Non-limiting examples of specific metal alkoxides include tetra(methoxy) titanate, tetra(ethoxy) titanate, tetra(isopropoxy) titanate, tetra(n-propoxy)titanate, tetra(butoxy) titanate, 2-ethylhexyloxy titanate, octylene glycol titanate, poly(n-butoxy) titanate, triethanolamine titanate, n-butyl zirconate, n-propyl zirconate, titanium acetyl acetonate, ethyl acetoacetic ester titanate, isostearoyl titanate, titanium lactate, zirconium lactate, zirconium glycolate, methyltriacetoxy silane, fluorinated silanes (e.g., such as fluorinated polyether silanes disclosed in U.S. Pat. No. 6,991,826), tetra (n-propoxy) zirconate, and mixtures thereof. Additional examples include vaporizable prepolymerized forms of the above metal alkoxides including dimers, trimers, and longer oligomers including polydimethoxysiloxane and polybutyl titanate. Additional metal alkoxides include methoxy, ethoxy, n-propoxy, butoxy, acetoxy, and isopropoxy functionalized metal atoms, and prepolymerized forms of those metal alkoxides, including tetra(ethoxy) titanate, tetra(n-propoxy) titanate, tetra(isopropoxy) titanate, methyltriacetoxy silane, fluorinated silanes, polydimethoxy silane, and tetra(n-propoxy) zirconate. Specific metal alkoxides include functionalized trimethoxy and functionalized trimethoxy silanes. Alkoxide mixtures may be selected to provide a preselected property, e.g., index of refraction or predetermined hardness, for the inorganic or hybrid organic/inorganic layer.

The metal alkoxides can be applied to a substrate using a variety of methods known in the art including solution coating, extrusion coating, roll coating (e.g., gravure roll coating), or spray coating (e.g., electrostatic spray coating), and evaporation followed by vapor deposition. Exemplary evaporation methods include, e.g., flash evaporation, using techniques like those disclosed in U.S. Pat. Nos. 4,954,371 and 6,045, 864, sublimation, and the like. The alkoxide may be condensed onto the substrate at a temperature below the condensation point of the vapor stream.

The condensed alkoxide layer is cured by heating the layer using a catalytic combustion burner and contacting the layer with water. The catalytic combustion heater can provide water vapor. An exemplary catalytic combustion heat source is an infrared ("IR") burner manufactured by the Flynn Burner Corporation of New Rochelle, N.Y.

The products of a catalytic combustion reaction include heat and water vapor, which can be useful for curing metal alkoxide films/layers and can provide rapid hydrolysis reactions. Catalytic-combustion processes can be used to thermally cure materials without damaging the coating through excessive heating or from exposure to active oxidizing species such as H or OH radicals. Catalytic burners provide high heat flux which enables rapid curing of metal alkoxide materials such as functionalized trialkoxy alkylsilanes without causing a reaction to the functionalized alkyl group bound to the silane. The absence of gas-phase free radicals in catalytic combustion can provide an advantage for preserving the functional properties of the cured coatings.

In another embodiment, a metal alkoxide and an organic compound can be applied to a substrate to form a mixed layer. The mixed layer can be applied to a substrate using a variety of methods known in the art including solution coating, extrusion coating, roll coating (e.g., gravure roll coating), or spray coating (e.g., electrostatic spray coating), and evaporation followed by vapor deposition. The mixed layer is cured by heating the layer using a catalytic combustion burner and contacting the layer with water. Curing can involve reaction of the alkoxide with water while heating to solidify the film layer or increase its viscosity together with polymerization of the organic compound to form an intermixed film layer. Curing can also include reaction of the components of the layer (alkoxide and organic compound) together with or without water to form an organometallic copolymer. The hybrid films thus prepared can provide a layer or surface having beneficial properties such as refractive index to affect optical transmission, reflection, or absorption, surface protection (hardness or lubrication) properties, low or high surface energy to affect wettability or interactions with other materials, low adhesion (release) or high adhesion to contacting materials, electrical conductivity or resistivity, anti-soiling and easy-clean, and surface functionalization.

The organic compounds can be vaporized using any methods like those described above for vaporizing the metal alkoxide. The alkoxide and the organic compound can be evaporated together to form a mixed vapor or they can be evaporated separately and mixed in the vapor phase. The alkoxide and organic compound may be condensed onto the substrate at a temperature below the condensation point of the vapor stream.

Exemplary organic compounds include esters, vinyl compounds, alcohols, carboxylic acids, acid anhydrides, acyl halides, thiols, amines and mixtures thereof. Non-limiting examples of esters include (meth)acrylates, which can be used alone or in combination with other multifunctional or monofunctional (meth)acrylates. Exemplary acrylates include hexanediol diacrylate, ethoxyethyl acrylate, phenoxyethyl acrylate, cyanoethyl (mono)acrylate, isobornyl acrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2,2,2-trifluoromethyl acrylate, diethylene glycol diacrylate, triethylene glycol diacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, trimethylol propane triacrylate, ethoxylated trimethylol propane triacrylate, propylated trimethylol propane triacrylate, tris(2-hydroxyethyl)-isocyanurate triacrylate, pentaerythritol triacrylate, pentaerythritol tetraacrylate, phenylthioethyl acrylate, naphthyloxyethyl acrylate, Ebecryl 130 cyclic diacrylate (from Cytec Industries Inc., New Jersey), epoxy acrylate CN120E50 (from Sartomer Corporation), the corresponding methacrylates of the acrylates listed above and mixtures thereof. Exemplary vinyl compounds include vinyl ethers, styrene, vinyl naphthylene and acrylonitrile. Exemplary alcohols include hexanediol, naphthalenediol, 2-hydroxyacetophenone, 2-hydroxy-2-methyl-1-phenyl-1-propanone, and hydroxy-ethylmethacrylate. Exemplary vinyl compounds include vinyl ethers, styrene, vinyl naphthylene and acrylonitrile. Exemplary carboxylic acids include phthalic acid and terephthalic acid, (meth)acrylic acid). Exemplary acid anhydrides include phthalic anhydride and glutaric anhydride. Exemplary acyl halides include hexanedioyl dichloride, and succinyl dichloride. Exemplary thiols include ethyleneglycol-bisthioglycolate, and phenylthioethylacrylate. Exemplary amines include ethylene diamine and hexane 1,6-diamine.

Metal layers can be made from a variety of materials. Exemplary metals include elemental silver, gold, copper, nickel, titanium, aluminum, chromium, platinum, palladium, hafnium, indium, iron, lanthanum, magnesium, molybdenum, neodymium, silicon, germanium, strontium, tantalum, tin, titanium, tungsten, vanadium, yttrium, zinc, zirconium or alloys thereof. In one embodiment, silver can be coated on a cured alkoxide layer. When two or more metal layers are employed, each metal layer can be the same or different from another layer, and need not have the same thickness. In one embodiment, the metal layer or layers are sufficiently thick so as to be continuous, and sufficiently thin so as to ensure that the metal layer(s) and articles employing these layer(s) will have a desired degree of visible light transmission. For example, the physical thickness (as opposed to the optical thickness) of the visible-light-transmissive metal layer or layers may be from about 5 to about 20 nm, from about 7 to about 15 nm, or from about 10 nm to about 12 nm. The thickness range also will depend on the choice of metal. The metal layer(s) can be formed by deposition on the above-mentioned substrate or on the inorganic or hybrid layer using techniques employed in the metallizing art such as sputtering (e.g., rotary or planar magnetron sputtering), evaporation (e.g., resistive or electron beam evaporation), chemical vapor deposition (CVD), metalorganic CVD (MOCVD), plasma-enhanced, assisted, or activated CVD (PECVD), ion sputtering, plating and the like.

Polymeric layers can be formed from a variety of organic materials. The polymeric layer may be crosslinked in situ after it is applied. In one embodiment, the polymeric layer can be formed by flash evaporation, vapor deposition and polymerization of a monomer using, for example, heat, plasma, UV radiation or an electron beam. Exemplary monomers for use in such a method include volatilizable (meth)acrylate monomers. In a specific embodiment, volatilizable acrylate monomers are employed. Suitable (meth)acrylates will have a molecular weight that is sufficiently low to allow flash evaporation and sufficiently high to permit condensation on the substrate. If desired, the additional polymeric layer can also be applied using conventional methods such as plasma deposition, solution coating, extrusion coating, roll coating (e.g., gravure roll coating), spin coating, or spray coating (e.g., electrostatic spray coating), and if desired crosslinking or polymerizing, e.g., as described above. The desired chemical composition and thickness of the additional layer will depend in part on the nature of the substrate and the desired purpose for the article. Coating efficiency can be improved by cooling the substrate.

Films prepared using the disclosed method have a variety of uses including the preparation of surfaces for analytical and diagnostic tests, coupling or the promotion of bonding of molecules or coatings to the substrate, low adhesion (release) surfaces, lubrication, non-wetting surfaces, permeability barrier for packaging, fabrication of antireflective coatings, beam splitters, edge filters, subtraction filters, bandpass filters, Fabry-Perot tuned cavities, fabrication of dielectric layers, the preparation of permeability barrier layers, and other optical coating designs. Additional layers can be applied to the hybrid organic/inorganic layer to provide properties such as anti-reflective properties or to prepare a reflective stack having color shifting properties.

Films of the invention with color shifting properties can be used in security devices, for a variety of applications such as tamperproof images in value documents (e.g., currency, credit cards, stock certificates, etc.), driver's licenses, government documents, passports, ID badges, event passes, affinity cards, product identification formats and advertising promotions for verification or authenticity, e.g., tape cassettes, playing cards, beverage containers, brand enhancement images which can provide a floating or sinking or a floating and sinking image of the brand, information presentation images in graphics applications such as kiosks, night signs and automotive dashboard displays, and novelty enhancement through the use of composite images on products such as business cards, hang-tags, art, shoes and bottled products.

The smoothness and continuity of the film and the adhesion of subsequently applied layers to the substrate preferably can be enhanced by appropriate pretreatment of the substrate or application of a priming or seed layer prior to forming the inorganic or hybrid layer. Modification of the surface to create hydroxyl or amine functional groups is particularly desirable. Methods for surface modification are known in the art. In one embodiment, a pretreatment regimen involves electrical discharge pretreatment of the substrate in the presence of a reactive or non-reactive atmosphere (e.g., plasma, glow discharge, corona discharge, dielectric barrier discharge or atmospheric pressure discharge), chemical pretreatment, or flame pretreatment. These pretreatments can help ensure that the surface of the substrate will be receptive to the subsequently applied layers. Plasma pretreatment is particularly preferred. Another preferred pretreatment regimen involves coating the substrate with an inorganic or organic base coat layer optionally followed by further pretreatment using plasma or one of the other pretreatments described above. Organic base coat layers, and especially base coat layers based on crosslinked acrylate polymers, are especially preferred. Most preferably, the base coat layer is formed by flash evaporation and vapor deposition of a radiation-crosslinkable monomer (e.g., an acrylate monomer), followed by crosslinking in situ (using, for example, an electron beam apparatus, UV light source, electrical discharge apparatus or other suitable device), as described in U.S. Pat. Nos. 4,696,719, 4,722, 515, 4,842,893, 4,954,371, 5,018,048, 5,032,461, 5,097,800, 5,125,138, 5,440,446, 5,547,908, 6,045,864, 6,231,939 and 6,214,422; in published PCT Application No. WO 00/26973; in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996). If desired, the base coat can also be applied using conventional coating methods such as roll coating (e.g., gravure roll coating) or spray coating (e.g., electrostatic spray coating), then crosslinked using, for example, heat, UV radiation or an electron beam. The desired chemical composition and thickness of the base coat layer will depend in part on the nature of the substrate. For example, for a PET substrate, the base coat layer preferably is formed from an acrylate monomer and may for example have a thickness of only a few nm up to about 2 micrometers.

The films can be subjected to post-treatments such as heat treatment, UV or vacuum UV (VUV) treatment, or plasma treatment. Heat treatment can be conducted by passing the film through an oven or directly heating the film in the coating apparatus, e.g., using infrared heaters or heating directly on a drum. Heat treatment may for example be performed at temperatures from about 30° C. to about 175° C., about 35° C. to about 150° C., or about 40° C. to about 70° C.

An example of an apparatus 100 that can conveniently be used to perform the disclosed method is shown in FIG. 1. Powered reels 102a and 102b move substrate 104 back and forth through apparatus 100. Temperature-controlled rotating drum 106 and idlers 108a and 108b carry substrate 104 past electrical discharge source 110, and evaporator 114. Liquid alkoxide 118 is supplied to evaporator 114 from reservoir 120. Optionally, liquid 118 can be discharged into the evaporator through an atomizer (not shown). Optionally, gas flows (e.g., nitrogen, argon, helium) can be introduced into the atomizer or into the evaporator (not shown in FIG. 1). Catalytic heater 122 can be used to supply heat and water vapor. Water can also be supplied through the gas manifold in the electrical discharge source 110 or from the ambient environment after the alkoxide layer is condensed. Infrared lamp 124 can be used to heat the substrate prior to or after application of one or more layers. Successive layers can be applied to the substrate 104 using multiple passes (in either direction) through apparatus 100. Optional liquid monomer can be applied through evaporator 114 or a separate evaporator (not shown) supplied from reservoir 120 or a separate reservoir (not shown). UV lamps 116 can be used to produce a crosslinked polymer layer from the monomer. Apparatus 100 can be enclosed in a suitable chamber (not shown in FIG. 1) and supplied with a suitable inert atmosphere in order to discourage oxygen, dust and other atmospheric contaminants from interfering with the various pretreatment, alkoxide coating, and crosslinking steps.

Figure 2:
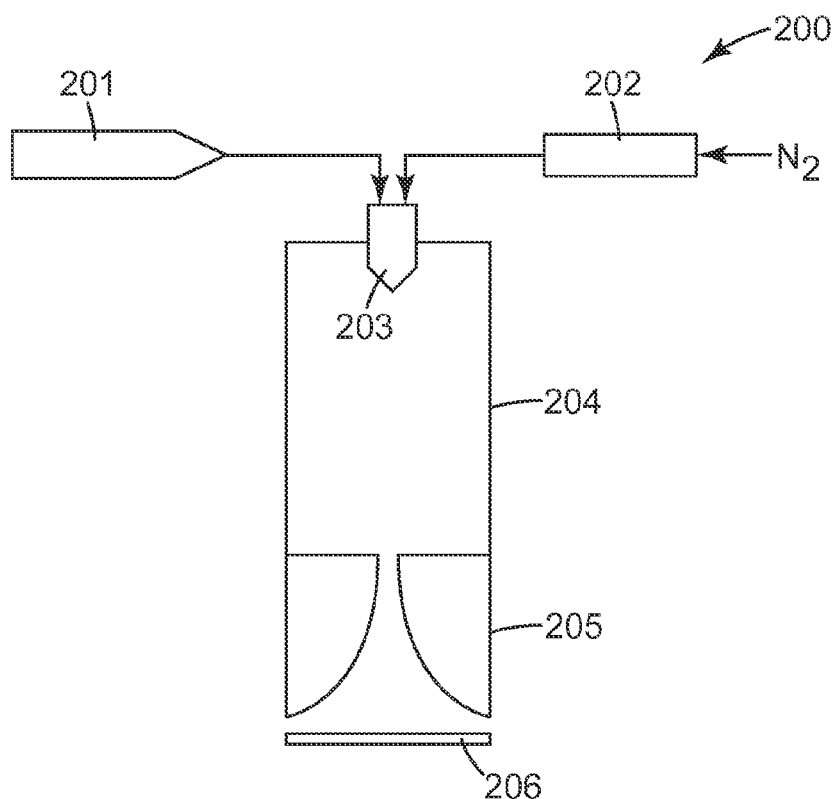
FIG. 2 is a schematic representation of a static, step-and-repeat, in-line or conveyor coater suitable for use in the disclosed method.

Another example of an apparatus 200 that can conveniently be used to perform the disclosed method is shown in FIG. 2. Liquid alkoxide in syringe pump 201 is mixed with nitrogen from heater 202 in atomizer 203 which atomizes the alkoxide. The resulting droplets can be delivered to vaporizer 204 where the droplets are vaporized. The vapor passes through diffuser 205 and condenses on substrate 206. The substrate 206 with condensed alkoxide is treated in-place or removed and exposed to heat from a catalytic combustion source in the presence of water to cure the alkoxide in a subsequent step. Apparatus 200 can be used to apply optional liquid monomer through syringe pump 201 or a separate syringe pump (not shown). The condensed monomer on substrate 206 is crosslinked in a subsequent step.

The addition of a UV absorptive cover layer can also be desirable in order to protect any inner layers of the article that may be unstable when exposed to UV radiation. Other functional layers or coatings that can be added to the inorganic or hybrid film include an optional layer or layers to make the article more rigid. The uppermost layer of the article is optionally a suitable protective layer. If desired, the protective layer can be applied using conventional coating methods such as roll coating (e.g., gravure roll coating) or spray coating (e.g., electrostatic spray coating), then crosslinked using, for example, UV radiation. The protective layer can also be formed by flash evaporation, vapor deposition and crosslinking of a monomer as described above. Volatilizable (meth) acrylate monomers are suitable for use in such a protective layer. In a specific embodiment, volatilizable acrylate monomers are employed.

The invention is further illustrated in the following examples, in which all parts, percentages and ratios are by weight unless otherwise indicated.

EXAMPLE 1

Fluorinated Polyether Coating

A 12×9 inch, 0.375-inch-thick polycarbonate plate was coated with a fluorinated polyether oligomer functionalized with trimethoxy silane functional groups at each end and the general formula:

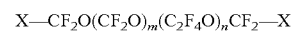

where X=CONHCH$_2$CH$_2$CH$_2$Si(OCH$_3$)$_3$, m is about 10, n is about 10, and having an average molecular weight of about 2000. The fluorinated trialkoxysilane polyether oligomer was atomized and evaporated using methods such as those described in U.S. Pat. No. 6,045,864 and FIG. 2. The liquid flow rate into the atomizer was 0.075 ml/min. The hot nitrogen flow into the atomizer was 44 lpm at a temperature of 186° C. The evaporator zone temperature was 162° C. The substrate was exposed to the vapor flow exiting the diffuser for 5 seconds to form a very thin, condensed liquid coating on the polycarbonate plate.

The liquid coating of the fluorinated polyether deposited on the polycarbonate was cured by exposure to the elevated-temperature flux of water vapor from a catalytic burner manufactured by the Flynn Burner Corporation of New Rochelle, New York. The gap between the face of the catalytic burner and the coated substrate was about 3 cm. The 12×4 inch catalytic burner was supported by combustible mixture consisting of 385 ft$^3$/hr of dried, dust-filtered air and 40 ft$^3$/hr of natural gas, which yields a flame power of 40,000 Btu/hr-in. The flame equivalence ratio was 1.00. The uncured liquid was exposed to the hot combustion products of the catalytic burner for <2 seconds. After curing, the coating showed hydrophobic properties and was repellent to solvent-based ink.

COMPARATIVE EXAMPLE 1

Fluorinated Polyether Coating

A similar coating prepared of the fluorinated trialkoxysilane polyether oligomer is prepared using the procedure of Example 1. The coating is cured in a convection air oven at 130-140° C. for 5-60 minutes to complete the cure. Time-of-flight secondary ion mass spectrometry (TOFSIMS) indicates that a 1 second exposure to the gaseous products from a catalytic burner cured the coating as completely as typically seen with a 1 hour, 130° C. oven cure.

EXAMPLE 2

Fluorinated Polyether Coating

Coatings of the fluorinated trialkoxysilane polyether oligomer cured by exposure to the products of a catalytic combustion heater were also prepared on 3-inch diameter silicon wafers, on glass wafers, on biaxially oriented polypropylene substrates (BOPP) and on biaxially oriented poly(ethylene terephthalate) substrates. The catalytic heater provided a high degree of cure and liquid repellency was noted on cured materials.

EXAMPLE 3

Fluorinated Polyether Coating

A polycarbonate plate 12 inches×9 inches was coated with the fluorinated trialkoxysilane polyether oligomer, using the procedure of Example 1, with the following changes: the diffuser was replaced with a slot coating die 10 inches wide, the liquid monomer flow rate was 0.10 ml/min, the nitrogen flow to the atomizer was 50 lpm at 300° C., the evaporation zone temperature was 300° C., and the substrate was moved past the coating die slot at 1 inch/second. The liquid coating was cured by exposure to a hot flux of water vapor from a catalytic combustion source. The 12×4 inch catalytic burner (Flynn Burner Corp.) was supported by combustible mixture consisting of 385 ft$^3$/hr of dried, dust-filtered air and 40 ft$^3$/hr of natural gas, which provided a flame power of 40,000 Btu/hr-in. The flame equivalence ratio was 1.00. The gap between the catalytic burner and the coated substrate was about 2 inches. The exposure time was less than 2 seconds. After curing, the coating was repellent to solvent-based ink.

Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure and the claims shown below are not limited to the illustrative embodiments set forth herein.

We claim:

1. A method for forming an inorganic or hybrid organic/inorganic layer on a substrate, which method comprises:
    applying a metal alkoxide layer to a substrate; and
    completely curing the metal alkoxide layer by: (i) exposing the metal alkoxide layer to heat from a catalytic combustion burner; and (ii) contacting the metal oxide layer with water produced by the catalytic combustion burner;
    wherein the step of exposing the metal alkoxide layer to heat comprises heating the layer for no more than about 10 seconds.

2. The method of claim 1, wherein applying the alkoxide layer comprises condensing a vaporized metal alkoxide to form a layer atop the substrate.

3. The method of claim 1, wherein the metal alkoxide comprises an alkoxide of aluminum, antimony, arsenic, barium, bismuth, boron, cerium, gadolinium, gallium, germanium, hafnium, indium, iron, lanthanum, lithium, magnesium, molybdenum, neodymium, phosphorus, silicon, sodium, strontium, tantalum, thallium, tin, titanium, tungsten, vanadium, yttrium, zinc, and zirconium, or a mixture thereof.

4. The method of claim 3, wherein the metal alkoxide comprises an alkoxide of titanium, zirconium, silicon, aluminum, tantalum, barium, tin, indium, zinc, gallium, bismuth, magnesium, strontium, boron, cerium, hafnium, neodymium, lanthanum, tungsten, or a mixture thereof.

5. The method of claim 4, wherein the metal alkoxide comprises tetra(ethoxy) titanate, tetra(isopropoxy) titanate, tetra(n-propoxy)titanate, polydimethoxysiloxane, methyltriacetoxy silane, tetra(n-propyl) zirconate, tetra(n-butoxy) zirconate, or a mixture thereof.

6. The method of claim 3, wherein the metal alkoxide comprises a trialkoxysilane.

7. The method of claim 3, wherein the metal alkoxide comprises a mixture of at least two alkoxides, and the proportions of the alkoxides are selected to provide a predetermined index of refraction for the inorganic or hybrid organic/inorganic layer.

8. The method of claim 3, wherein the metal alkoxide comprises a mixture of at least two alkoxides, and the proportions of the alkoxides are selected to provide a predetermined hardness for the inorganic or hybrid organic/inorganic layer.

9. The method of claim 1, wherein the step of exposing the metal alkoxide layer to heat comprises heating the layer for no more than about 5 seconds.

10. The method of claim 1, wherein the step of exposing the metal alkoxide layer to heat comprises heating the layer for no more than about 2 seconds.

11. The method of claim 1, wherein the substrate is a polymer, metal, glass, ceramic, composite, paper, or wood.

12. The method of claim 11, wherein the substrate is a polymer.

13. The method of claim 12, wherein the polymer is a polyester.

14. The method of claim 13, where the polyester is poly(ethylene terephthalate).

15. A method for forming a hybrid organic/inorganic layer on a substrate, which method comprises:

applying a metal alkoxide and an organic compound to form a layer on a substrate; and completely curing the layer by: (i) exposing the layer to heat from a catalytic combustion burner; and (ii) contacting the layer with water produced by the catalytic combustion burner;

wherein the step of exposing the layer to heat comprises heating the layer for no more than about 10 seconds.

16. The method of claim 15, wherein applying the alkoxide and organic compound layer comprises condensing a mixture of a vaporized metal alkoxide and a vaporized organic compound to form a layer atop the substrate.

17. The method of claim 16, wherein the vaporized alkoxide and vaporized organic compound are vaporized separately and mixed in the vapor phase before condensing atop the substrate.

18. The method of claim 16, wherein the alkoxide and the organic compound are vaporized together.

19. The method of claim 15, wherein the alkoxide and the organic compound are vaporized using flash evaporation.

20. The method of claim 15, wherein the step of exposing the layer to heat comprises heating the layer for no more than about 5 seconds.

21. The method of claim 15, wherein the step of exposing the layer to heat comprises heating the layer for no more than about 2 seconds.

22. The method of claim 15, wherein the organic compound comprises an alcohol, carboxylic acid, ester, acid anhydride, acetyl halogen, thiol, or amine.

23. The method of claim 22, wherein the ester comprises an acrylate.

* * * * *

UNITED STATES PATENT AND TRADEMARK OFFICE
CERTIFICATE OF CORRECTION

PATENT NO. : 8,227,040 B2  Page 1 of 1
APPLICATION NO. : 12/521604
DATED : July 24, 2012
INVENTOR(S) : Mark Anthony Strobel It is certified that error appears in the above-identified patent and that said Letters Patent is hereby corrected as shown below:

Column 3

Line 35; Delete "$R^1$)" and insert -- $R^b$ --, therefor.

Line 57; Delete "zirconium." and insert -- zirconium, --, therefor.

Signed and Sealed this
Twenty-third Day of October, 2012

David J. Kappos
*Director of the United States Patent and Trademark Office*